United States Patent
Pavao-Moreira et al.

(10) Patent No.: US 9,425,748 B2
(45) Date of Patent: Aug. 23, 2016

(54) AMPLIFIER CIRCUIT, BI-STAGE AMPLIFIER CIRCUIT, MULTI-STAGE AMPLIFIER CIRCUIT, RF-AMPLIFIER CIRCUIT, RECEIVER SECTION, RF-TRANSCEIVER, AND INTEGRATED CIRCUIT

(71) Applicants: Cristian Pavao-Moreira, Frouzins (FR); Birama Goumballa, Larra (FR)

(72) Inventors: Cristian Pavao-Moreira, Frouzins (FR); Birama Goumballa, Larra (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/556,617

(22) Filed: Dec. 1, 2014

(65) Prior Publication Data

US 2015/0349729 A1    Dec. 3, 2015

(30) Foreign Application Priority Data

May 20, 2014  (WO) .................. PCT/IB2014/001215

(51) Int. Cl.
*H03F 1/02* (2006.01)
*H03F 3/195* (2006.01)
(Continued)

(52) U.S. Cl.
CPC .............. *H03F 1/0261* (2013.01); *H03F 3/191* (2013.01); *H03F 3/195* (2013.01); *H03F 3/26* (2013.01); *H03F 3/3011* (2013.01); *H03F 3/45085* (2013.01); *H03F 2200/411* (2013.01); *H03F 2200/451* (2013.01); *H03F 2200/555* (2013.01); *H03F 2203/30081* (2013.01); *H03F 2203/30144* (2013.01); *H03F 2203/45466* (2013.01);

(Continued)

(58) Field of Classification Search
CPC ............ G09G 3/36; G11B 5/09; G11C 13/00; G11C 19/28; H02B 1/24; H02M 1/32; H02M 3/335; H02M 7/5387; H03F 1/0216; H03F 1/22; H03F 3/16; H03F 3/19; H03F 3/68; H03F 3/45; H03G 3/10; H03K 3/00; H03K 17/161; H03K 19/003; H03K 19/0175; H03K 19/08; H03L 7/00; H03M 1/66; H04B 1/16; H04B 1/3827
USPC ............ 326/83; 327/108, 142, 180, 382, 394; 330/254, 256, 285; 345/100; 363/56.05, 16; 375/219, 295, 316; 455/205

See application file for complete search history.

(56) References Cited

U.S. PATENT DOCUMENTS 3,383,613 A  5/1968 Novak
5,233,234 A  8/1993 Tago
(Continued)

*Primary Examiner* — Sam K Ahn
*Assistant Examiner* — Shawkat M Ali
(74) *Attorney, Agent, or Firm* — Charlene R. Jacobsen (57) ABSTRACT

The present invention relates to an amplifier circuit, comprising: first to fourth semiconductor amplifiers for controlling first to fourth currents between supply and output terminals, a first input terminal connected to provide a first input signal to a first control terminal of the first semiconductor amplifier and to a fourth control terminal of the fourth semiconductor amplifier, and a second input terminal connected to provide a second input signal to a second control terminal of the second semiconductor amplifier and to a third control terminal of the third semiconductor amplifier.

The present invention also relates to a bi-stage amplifier circuit, and to a multi-stage amplifier circuit comprising a cascade of a number of amplifier circuits complying to the present invention, the multi-stage amplifier circuit having a gain control logic prepared to control a gain of at least one of the amplifier circuits.

15 Claims, 10 Drawing Sheets

(51) Int. Cl.
  *H03F 3/30* (2006.01)
  *H03F 3/45* (2006.01)
  *H03F 3/191* (2006.01)
  *H03F 3/26* (2006.01)

(52) U.S. Cl.
  CPC .............. *H03F2203/45544* (2013.01); *H03F 2203/45562* (2013.01); *H03F 2203/45644* (2013.01); *H03F 2203/45694* (2013.01); *H03F 2203/45696* (2013.01)

(56) References Cited

U.S. PATENT DOCUMENTS

| | | | |
|---|---|---|---|
| 7,224,135 B1 * | 5/2007 | Menegoli | G11B 19/28 318/294 |
| 7,589,593 B2 * | 9/2009 | Lai | H03F 1/223 330/295 |
| 7,697,915 B2 | 4/2010 | Behzad et al. | |
| 7,741,910 B2 | 6/2010 | Wong | |
| 9,184,684 B2 * | 11/2015 | Tsai | H02P 7/0044 |
| 2004/0150434 A1 * | 8/2004 | Lu | 327/112 |
| 2006/0017538 A1 * | 1/2006 | Magoon et al. | 336/182 |
| 2007/0221997 A1 * | 9/2007 | Chen | H02P 7/0044 257/379 |
| 2007/0247219 A1 * | 10/2007 | Jesus Rodriguez | H03F 1/34 330/10 |
| 2008/0246511 A1 * | 10/2008 | Miura et al. | 326/83 |
| 2010/0109789 A1 * | 5/2010 | Presti | H03C 1/00 332/149 |
| 2010/0291890 A1 * | 11/2010 | Lee | 455/205 |
| 2012/0013317 A1 * | 1/2012 | Morino | G05F 1/565 323/280 |
| 2012/0032742 A1 * | 2/2012 | Hsieh et al. | 330/285 |
| 2013/0241654 A1 * | 9/2013 | Mikhemar | H03G 1/0029 330/278 |

* cited by examiner

AMPLIFIER CIRCUIT, BI-STAGE AMPLIFIER CIRCUIT, MULTI-STAGE AMPLIFIER CIRCUIT, RF-AMPLIFIER CIRCUIT, RECEIVER SECTION, RF-TRANSCEIVER, AND INTEGRATED CIRCUIT

CROSS REFERENCE TO RELATED APPLICATION(S)

The present application claims priority to International Patent Application No. PCT/IB2014/001215, entitled "AMPLIFIER CIRCUIT, BI-STAGE AMPLIFIER CIRCUIT, MULTI-STAGE AMPLIFIER CIRCUIT, RF-AMPLIFIER CIRCUIT, RECEIVER SECTION, RF-TRANSCEIVER, AND INTEGRATED CIRCUIT," filed on May 20, 2014, the entirety of which is herein incorporated by reference.

FIELD OF THE INVENTION

The present invention pertains to an amplifier circuit, to a bi-stage amplifier circuit, to a multi-stage amplifier circuit, to a RF-transceiver, to a radio device, and to an integrated circuit.

BACKGROUND OF THE INVENTION

Automotive radar applications are becoming very popular. In order to increase available production capacity and products reliability, efforts are made to integrate more functions inside a single chip (towards a fully-integrated transceiver) and to simplify assembly and production by using a packaged solution. Next generation of automotive radar products may move from today's bare die solution to a fully integrated packaged solution. Use of a given packaging technology may impose new challenges in terms of thermal dissipation and overall power consumption. U.S. Pat. No. 3,383,613A describes an amplifier comprising four transistors of same type connected as full-bridge having four arms and junctions therebetween with a transistor in each arm of the bridge. Two of said junctions form terminals of a differential output. For coupling an output of a driver amplifier to the amplifier, a coupling transformer having four secondary windings is employed. Each of the secondary windings is prepared for feeding the base terminal of another one of the four transistors.

Although the structure of this known full-bridge power amplifier may help to fulfill the above object of reducing overall power consumption of an automotive radar product, today's standard production processes impose the challenge of avoiding a coupling transformer as employed in the known amplifier.

SUMMARY OF THE INVENTION

The present invention provides an amplifier circuit, a bi-stage amplifier circuit, a multi-stage amplifier circuit, a RF-transceiver (RF=radio frequency), a radio device, and an integrated circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the Figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components, software and circuits known to those skilled in the art, details will not be explained in any greater extent than that considered necessary for the understanding and appreciation of the underlying concepts of the present invention and in order not to obfuscate or distract from the teachings of the present invention.

Figure 1:
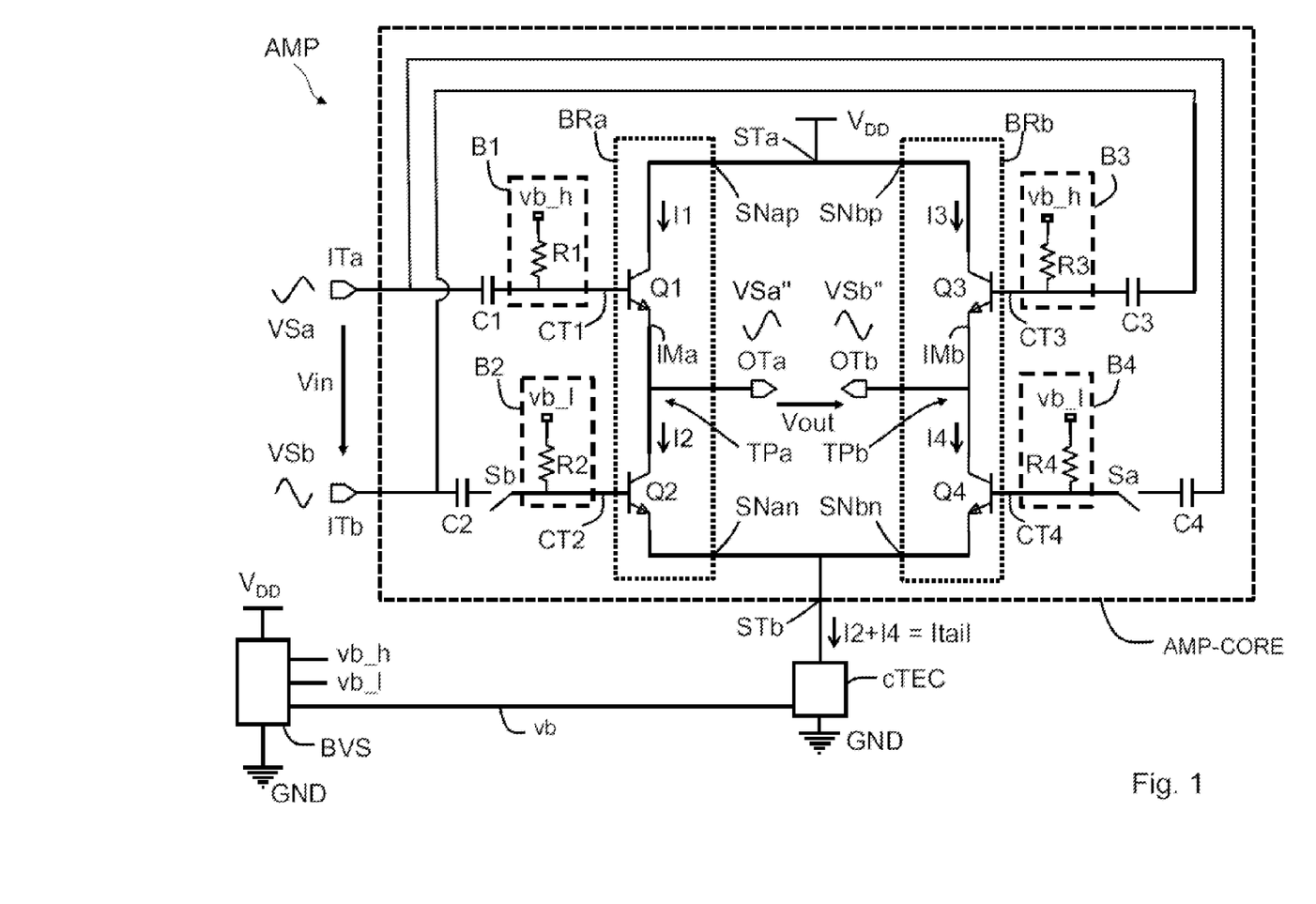
FIG. 1 schematically shows a circuit diagram of a first example of an amplifier circuit.

FIG. 1 schematically shows a circuit diagram of a first example of an amplifier circuit AMP comprising an amplifier core AMP-CORE, a common tail circuit cTEC, and a bias voltage supply circuit BVS.

The amplifier core AMP-CORE may comprise a first branch BRa, a second branch BRb, a positive supply terminal STa, a negative supply terminal STb, a first output terminal OTa, a second output terminal OTb, a first input terminal ITa, and a second input terminal ITb.

The first branch BRa may have a first positive supply node SNap and a first negative supply node SNan. The first branch BRa may comprise a first semiconductor amplifier Q1 and a second semiconductor amplifier Q2. A first main current path of the first semiconductor amplifier Q1 may be connected by a first intermediate connection IMa in series to a second main current path of the second semiconductor amplifier Q2. A first tap TPa at the first intermediate connection IMa may be connected to the first output terminal OTa.

The second branch BRb may have a second positive supply node SNbp and a second negative supply node SNbn. The second branch BRb may comprise a third semiconductor amplifier Q3 and a fourth semiconductor amplifier Q4. A third main current path of the third semiconductor amplifier Q3 may be connected by a second intermediate connection IMb in series to a fourth main current path of the fourth semiconductor amplifier Q4. A second tap TPb at the second intermediate connection IMb may be connected to the second output terminal OTb.

The first SNap and second SNbp positive supply nodes may be connected to the positive supply terminal STa. The first SNan and second SNbn negative supply nodes may be connected to the negative supply terminal STb.

The first semiconductor amplifier Q1 may be provided for controlling a first current I1 on the first main current path between the first supply node STa and the first tap TPa. The second semiconductor amplifier Q2 may be provided for controlling a second current I2 on the second main current path between the first tap TPa and the second supply node STb. The third semiconductor amplifier Q3 may be provided for controlling a third current I3 on the third main current path between the first supply node STa and the second tap TPb. The fourth semiconductor amplifier Q4 may be provided for controlling a fourth current I4 on the fourth main current path between the second tap TPb and the second supply node STb.

As shown in the example, the amplifier circuit AMP may be a differential amplifier. The pair of first ITa and second input ITb terminals may form a differential input port of the amplifier circuit AMP. The pair of first OTa and second OTb output terminals may form a differential output port of the amplifier circuit AMP. Connecting the first input terminal ITa to both, a first control terminal CT1 of the first semiconductor amplifier Q1 and to a fourth control terminal CT4 of the fourth semiconductor amplifier Q4 may help to avoid a need of a coupling transformer employed in known full-bridge amplifiers. Same may apply to a connection of the second input terminal ITb to both, a second control terminal CT2 of the second semiconductor amplifier Q2 and to a third control terminal CT3 of the third semiconductor amplifier Q3.

The amplifier circuit AMP may comprise a first DC-insulation C1 (DC=direct current) between the first input terminal ITa and the first control terminal CT1, connected thereto. The first DC-insulation C1 may comprise a first capacitor. The amplifier circuit AMP may comprise a second DC-insulation C2 between the second input terminal ITb and the second control terminal CT2, connected thereto. The second DC-insulation C2 may comprise a second capacitor. The amplifier circuit AMP may comprise a third DC-insulation C3 between the second input terminal ITb and the third control terminal CT3, connected thereto. The third DC-insulation may comprise a third capacitor. The amplifier circuit AMP may comprise a fourth DC-insulation C4 between the first input terminal ITa and the fourth control terminal CT4, connected thereto. The fourth DC-insulation C4 may comprise a fourth capacitor.

The DC-decoupling capacitors C1, C2, C3, C4 may be adjusted for setting a cutoff frequency of the RC high passes (RC=resistor plus capacitor).

At least one of the DC-insulations may comprise optocouplers for transferring the respective input signal VSa, VSb to the related pair of control terminals CT1, CT4, or CT2, CT3, respectively (not explicitly illustrated in the figures). Any of the optocouplers may have a photosensor. The photosensor may comprise at least one of a photoresistor, a photodiode, and a phototransistor, or of another type of photosensing device. At least one of the semiconductor amplifiers Q1, Q2, Q3, Q4 may comprise the photosensor.

Alternatively, or in addition, at least one of a transformer and a micro-mechanical coupler may be employed for DC-insulation.

For a differential operation, during the positive cycle of a differential input signal V Sin=VSa−VSb, the third semiconductor amplifier Q3 may act as a classical follower (gain G=1) copying the first input voltage component VSa to the second output terminal OTb. At the same cycle, the first branch BRa comprising stacked semiconductor amplifiers Q1 and Q2 may operate as a gm2×Zload buffer. Zload may be an impedance of a load of the semiconductor amplifier Q2. Zload may be 1/gm1.

gm1 may be a transductance of the first semiconductor amplifier Q1, gm2 may be a transductance of the second semiconductor amplifier Q2, gm3 may be a transductance of the third semiconductor amplifier Q3, and gm4 may be a transductance of the fourth semiconductor amplifier Q4. The term 'transductance' may generally be used for designating a ratio of a current change ΔIout at an output port SNap, TPa, SNbp, TPb of any of the semiconductor amplifiers Q1, Q2, Q3, Q4 to a voltage change ΔVin at an input port CT1, CT2, CT3, CT4 of the respective semiconductor amplifier Q1, Q2, Q3, Q4. The transductance may be written as gm=ΔIout/ΔVin. Each of the transductances gm1, gm2, gm3, gm4 may be a transistor transconductance of a bipolar transistor or of a MOSFET, respectively.

When the semiconductor amplifiers Q1 and Q2 may present a high gain G (beta), collector and emitter currents may be almost equivalent (Ic≈Ie or simply I1=I2). Generally, the term 'beta' may be used for designating a common-emitter current gain, which may be approximately the ratio of a DC collector current to a DC base current in forward-active region of a bipolar transistor.

A gain of the left branch BRa (having Q1 and Q2) may be gm2×1/gm1. Both semiconductor amplifiers Q1 and Q2 may present a same transconductance (gm1=gm2=gm). The gain G of the left branch BRa (having Q1 and Q2) may simply equal to 1, as with a classical follower, however with an opposite polarity (VSa"=−VSb). A gain of the right branch BRb (having Q3 and Q4) may be gm4×1/gm3. Both semiconductor amplifiers Q3 and Q4 may present the same transconductance (gm3=gm4=gm). The gain G of the right branch BRb (having Q3 and Q4) may simply equal to 1, as with a classical follower, however with an opposite polarity (VSb"=−VSa).

The amplifier circuit AMP may comprise a respective bias circuit B1, B2, B3, B4 for each or any of the control terminals CT1, CT2, CT3, CT4. Each or any of the bias circuits B1, B2, B3, B4 may comprise a resistor R1, R2, R3, R4 connecting the control terminal to a bias voltage supply circuit BVS for adjusting bias currents of each or any of the semiconductor amplifiers Q1, Q2, Q3, Q4.

At least two of the bias circuits B1, B2, B3, B4 may be connected to the same bias voltage supply circuit BVS. The use of the same bias supply circuit BVS may allow to reduce current consumption. The first Q1 and third Q3 semiconductor amplifiers may share a first bias supply voltage Vb_h (see FIGS. 1 and 3 to 5). The second Q2 and fourth Q4 semiconductor amplifiers may share a second bias supply voltage Vb_l (see FIGS. 1 and 3 to 5). The bias voltage supply circuit BVS may be configured to provide both, the first Vb_h and the second Vb_l bias supply voltages (see FIGS. 1 and 3 to 5).

The amplifier circuit AMP may comprise a common tail element circuit cTEC connected to the second supply terminal STb (or to the first supply terminal STa). The common tail element circuit cTEC may be employed for equally biasing each branch BRa, BRb of the amplifier circuit AMP. The common tail element circuit cTEC may comprise a current source controlled by a bias supply voltage vb provided by the same bias supply voltage circuit BVS (or a further bias supply voltage circuit not illustrated in the figures). The common tail element circuit cTEC may provide a constant current Itail=I2+I4. Each or any of the four semiconductor amplifiers Q1, Q2, Q3, Q4 may be operated at a bias current I1, I2, I3, I4, respectively, of a same level Itail/2.

The common tail element circuit cTEC may be connected to the first STa or to the second STb supply terminal for enforcing an anti-synchronous amplifier operation of a second branch BRb of the amplifier circuit AMP in relation to an amplifier operation of a first branch BRa of the amplifier circuit AMP, the first branch BRa comprising the first Q1 and second Q2 semiconductor amplifiers, the second branch BRb comprising the third Q3 and fourth Q4 semiconductor amplifiers.

All four semiconductor amplifiers Q1, Q2, Q3, Q4 may be implemented as bipolar transistors, field-effect transistors (FET), MOSFETs, or transistors of another type.

The amplifier circuit AMP configuration of FIG. 1 uses a first pair Q1, Q2 of stacked NPN bipolar semiconductor amplifiers and a cross-coupling of a differential input signal V Sin=VSa−VSb of a first pair Q1, Q2 of stacked NPN bipolar semiconductor amplifiers to a second pair Q3, Q4 of stacked NPN bipolar semiconductor amplifiers to provide twice the gain G of a conventional emitter follower circuit. Generally, the terms PNP and NPN may be used for designating a type of a doping sequence of three main terminal regions of a bipolar transistor. An NPN transistor may comprise two n doped semiconductor junctions that may share a thin p doped anode region. A PNP transistor may comprise two p doped semiconductor junctions that may share a thin n doped cathode region. A 6 dB gain G (db=decibel) may be obtained thanks to the differential configuration and to the stacks of same type of semiconductor amplifiers (Q1, Q2), (Q3, Q4) with inverted input phases.

Figure 4:
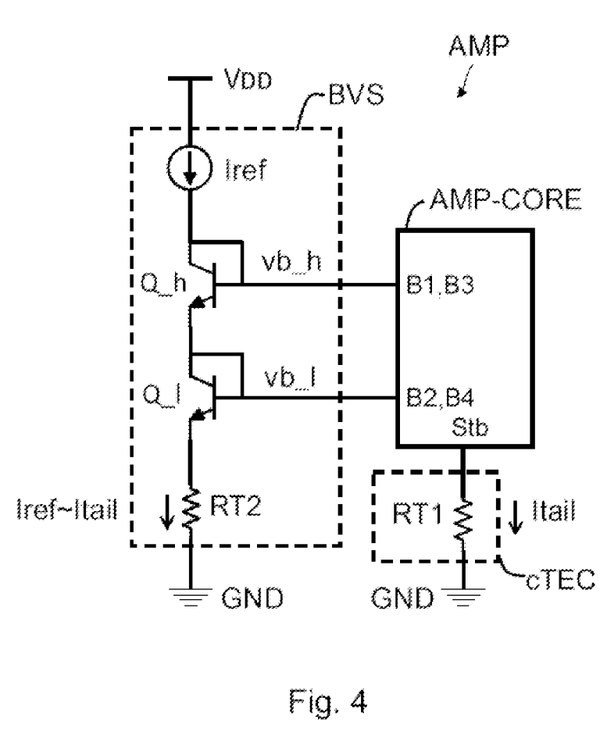
FIG. 4 schematically shows a circuit diagram of a third example of an amplifier circuit of an amplifier circuit according to FIG. 1, wherein the common tail element circuit comprises a resistor.
Figure 5:
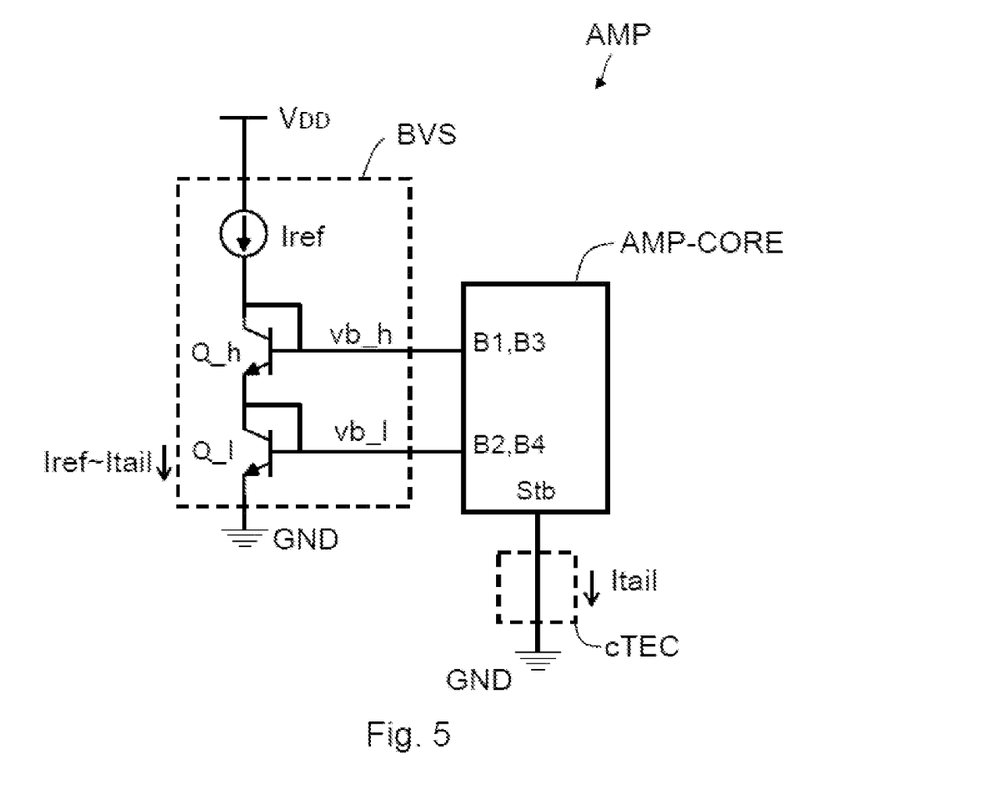
FIG. 5 schematically shows a circuit diagram of a fourth example of an amplifier circuit of an amplifier circuit according to FIG. 1, wherein the common tail element circuit is formed by an electrical connection from a negative supply terminal to ground.

For low supply voltage applications, the common tail element circuit cTEC may be replaced or represented by a tail resistor RT1 (see FIG. 4), or replaced or represented by a wire (see FIG. 5). The amplitude of the differential output voltage Vout=VSa"−VSb" at the output port OTa, OTb of the amplifier circuit AMP may be twice the amplitude of a conventional single follower, as follows from Equation 1a (see Table 1). This is also valid for the negative cycle of the first input voltage component VSa, with now the second branch BRb of the amplifier circuit AMP of FIG. 1 operating as a gm4×Zload buffer, with Zload now equal to 1/gm3, as shows Equation 1b.

When the bias voltages of the first CT1 and third CT3 control terminals have a same voltage level vb_h, while the bias voltages of the second CT2 and fourth CT4 control terminals have a same voltage level vb_l, while all semiconductor amplifiers Q1 to Q4 are of a same built, the currents I2 and I4 through the second Q2 and fourth Q4 semiconductor amplifiers may have a same level. This topology may provide an increased amplitude (gain G=2 corresponding to 6 dB) compared to a conventional follower (Gain=1), as shows Equation 2. The configuration of the stacked and cascaded NPN semiconductor amplifiers Q1, Q2, Q3, Q4 and the cross-coupling of the differential input signal Vin=VSa−VSb may provide (with same bias current) twice the voltage gain of a conventional emitter follower circuit. The amplifier circuit AMP may provide (with a same total overall current consumption I2+I4) a higher total gain G than that of a conventional amplifier circuit having only one branch BRa. For each cycle of the input signal V Sin=VSa−VSb, this topology may allow maintaining a low output impedance ZoutP, N as a classical follower has, see Equation 3.

TABLE 1

| Proof of concept of an amplifier circuit according to the present invention (for the bipolar case) | |
|---|---|
| VSb" − VSa" = VSb − VSa ≈ −2 VSa | Equation 1a |
| VSa" − VSb" = VSa − VSb ≈ 2 VSa | Equation 1b |
| high beta, gm2 = gm1 (Ic ≈ Ie) | Equation 2 |
| G = (gm2 × 1/gm1) × 2 | |
| G = 2 = 6 dB | |
| ZoutP, N = 1/gm | Equation 3 |

The semiconductor amplifiers Q1, Q2, Q3, Q4 may be bipolar semiconductor amplifiers or MOS-based semiconductor amplifiers (MOS=metal-oxide semiconductor). The semiconductor amplifiers Q1, Q2, Q3, Q4 may be NMOS semiconductor amplifiers, PMOS semiconductor amplifiers, NPN bipolar semiconductor amplifiers, PNP bipolar semiconductor amplifiers, CMOS semiconductor amplifiers, or another type of semiconductor amplifiers (NMOS=n channel metal-oxide semiconductor; PMOS=p channel metal-oxide semiconductor; NPN=doping sequence of main terminal regions; CMOS=complementary-metal-oxide semiconductor). Also, mixed configurations are possible, which may provide a final gain G different from 6 dB, since a transductance of the first Q1 and third Q3 semiconductor amplifiers would be different to a transductance of the second Q2 and fourth Q4 semiconductor amplifiers (see Equation 2).

The example of an amplifier circuit AMP in a differential gain-boosted follower buffer amplifier may be suitable for an energy-saving application. Because more gain may be provided at the same current, the current can be reduced for a same gain. Thus, the power consumption of products using the amplifier circuit may be reduced, notably when the amplifier circuit is used in a buffer stage. The amplifier circuit AMP may allow a same output amplitude for half the current drain of a conventional amplifier circuit. The amplifier circuit AMP allows a reduction of power dissipation with respect to a conventional emitter follower.

The gain G of the amplifier circuit AMP may be programmable by selectively enabling/disabling at least one of the connection between the first input terminal ITa and the fourth control terminal CT4 of the fourth semiconductor amplifier Q4 (see switch Sa) and the connection between the second input terminal ITb and the second control terminal CT2 of the second semiconductor amplifier Q2 (see switch Sb).

The amplifier circuit AMP may comprise a first switch Sa between the first input terminal ITa and the fourth control terminal CT4 for connecting the first input terminal ITa to the fourth control terminal CT4. The amplifier circuit AMP may comprise a second switch Sb between the second input terminal ITb and the second control terminal CT2 for connecting the second input terminal ITb to the second control terminal CT2.

A gain control of the amplifier circuit AMP may be obtained by selectively closing ON and opening OFF each of the switches Sa, Sb, as shown in Table 2. It will be apparent that the gain G with closed switches Sa, Sb may deviate from 6 dB (in particular it may be lower than 6 db) depending on the specific implementation and technology.

TABLE 2

Dependency of gain of amplifier circuit AMP on states of switches Sa, Sb

| G | Sa, Sb |
|---|---|
| 0 dB | open |
| +6 dB | closed |

These switches may be implemented as MOS switches (or other kind of switches). The switches may present a low intrinsic ON resistance (Ron) in order to not attenuate the input signal V Sin=VSa−VSb. The programmability may be controlled as follows: for 0 dB gain G, both switches Sa, Sb may be opened. Then, no signal flows to the control terminals of the second Q2 and fourth Q4 semiconductor amplifiers. Then, the second Q2 and fourth Q4 semiconductor amplifiers operate as simple current sources. Under this condition, the first Q1 and third Q3 semiconductor amplifiers of the amplifier circuit AMP may operate as a classical emitter (or common drain) follower. Consequently a unitary gain G may be obtained (G=1 corresponding to 0 dB). For the 6 dB gain step, both switches Sa, Sb may be closed. The semiconductor amplifiers Q2, Q4 may be active (input signal VSb and VSa may be present at the control terminals CT2, CT4, respectively); and the amplifier circuit AMP may operate as a boosted follower, as presented above.

Figure 2:
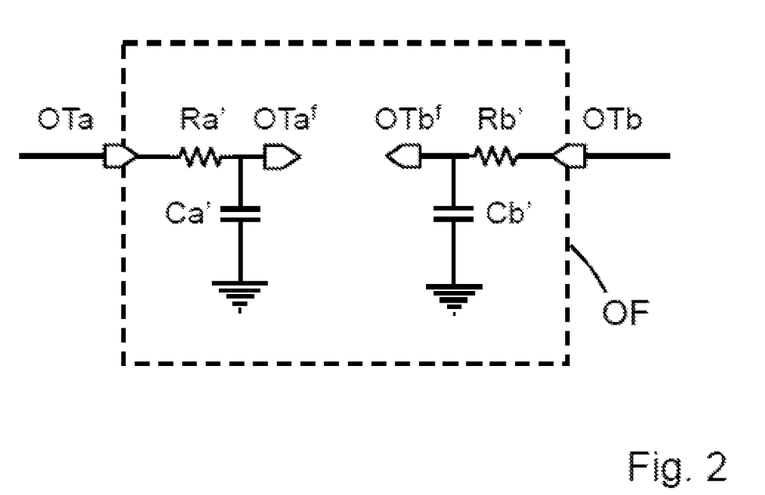
FIG. 2 schematically shows a circuit diagram of an example of an optional output filter circuit.

FIG. 2 schematically shows a circuit diagram of an example of an optional output filter circuit OF. The optional output filter circuit OF may be connected to the differential output port OTa, OTb of the amplifier AMP. A first RC filter comprising a first resistor Ra' and a first capacitor Ca' may be connected to the first output terminal OTa. A second RC filter comprising a second resistor Rb' and a second capacitor Cb' may be connected to the second output terminal OTb. The output terminals OTa', OTb' may form a differential output port of the amplifier circuit AMP, used separately or in any of the example embodiments described in the following.

Figure 3:
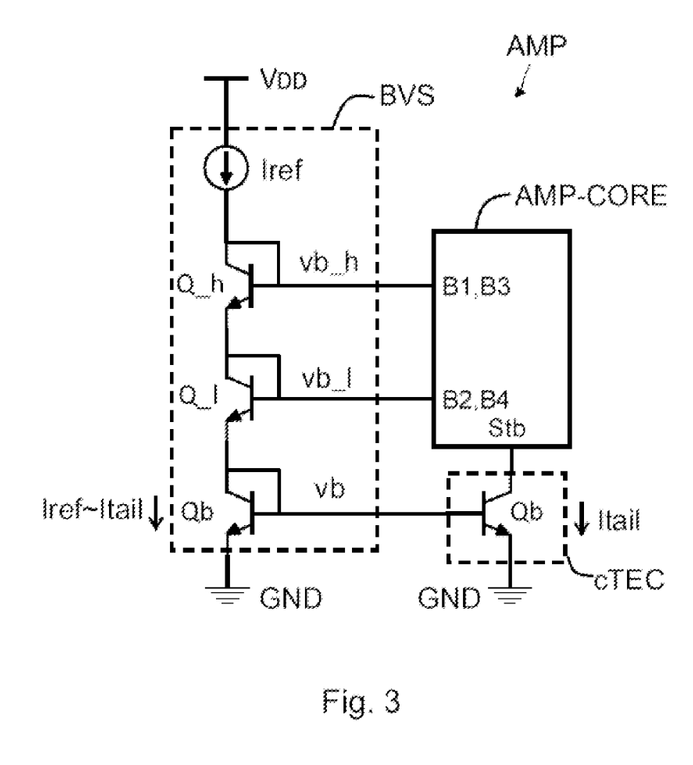
FIG. 3 schematically shows a circuit diagram of a second example of an amplifier circuit according to FIG. 1, wherein the common tail element circuit comprises a current source.

The FIGS. 3 to 5 show examples of amplifier circuits AMP each comprising another example of common tail element circuit cTEC. Such a common tail element circuit cTEC may comprise one or more electrical components. The common tail element circuit cTEC may comprise at least one of a resistor and a current-source.

FIG. 3 schematically shows a circuit diagram of a second example of an amplifier circuit AMP comprising an amplifier core AMP-CORE, a common tail circuit cTEC, and a bias voltage supply circuit BVS. The amplifier circuit AMP may comprise a common tail element circuit cTEC connected to the second STb (or to the first STa supply terminal not illustrated in FIG. 3). The common tail element circuit cTEC may comprise a current source controlled by a bias supply voltage vb provided by the bias supply voltage circuit BVS (or a further bias supply voltage circuit).

The bias voltage supply circuit BVS may comprise three current-to-voltage converters Q_h, Q_I, Qb connected in series to a reference current source Iref for providing the bias voltages vb_h, vb_I, and vb. At least one of the current-to-voltage converters Q_h, Q_I, Qb may comprise a bipolar transistor, wherein a base of the bipolar transistor is connected to a collector of the bipolar transistor, and wherein the base of the bipolar transistor serves as output terminal of the respective current-to-voltage converter Q_h, Q_I, Qb. The bias voltage vb_h may be a sum of base-to-emitter voltages of the three current-to-voltage converters Q_h, Q_I, Qb. The bias voltages vb_h, vb_I, vb may be calculable by following Equations:

$$vb\_h = vbe(Q\_h) + vbe(Q\_I) + vbe(Qb) \quad \text{(Equation 4a)};$$

$$vb\_I = vbe(Q\_I) + vbe(Qb) \quad \text{(Equation 4b)};$$

$$vb = vbe(Qb) \quad \text{(Equation 4c)}.$$

Generally, the term vbe (Q) may be used for designating a voltage between a base and an emitter of any bipolar transistor.

FIG. 4 schematically shows a circuit diagram of a third example of an amplifier circuit AMP comprising an amplifier core AMP-CORE, a common tail circuit cTEC, and a bias voltage supply circuit BVS. The amplifier circuit AMP may comprise a common tail element circuit cTEC connected to the second STb (or to the first STa supply terminal not illustrated in FIG. 4). The common tail element circuit cTEC may comprise a first tail resistor RT1.

The bias voltage supply circuit BVS may comprise three current-to-voltage converters Q_h, Q_I, RT2 connected in series to a reference current source Iref for providing the bias voltages vb_h, vb_I. The third current-to-voltage converter RT2 may be a second resistor. The second tail resistor RT2 may have the resistance value of RT1. At least one of the current-to-voltage converters Q_h, Q_I may comprise a bipolar transistor, wherein a base of the bipolar transistor is connected to a collector of the bipolar transistor, and wherein the base of the bipolar transistor serves as output terminal of the respective current-to-voltage converter Q_h, Q_I. The bias voltage vb_h may be a sum of base-to-emitter voltages of the current-to-voltage converters Q_h and Q_I, and the voltage drop across the second tail resistor RT2. The bias voltages vb_h and vb_I may be calculable by following Equations:

$$vb\_h = vbe(Q\_h) + vbe(Q\_I) + (RT2)(Iref) \quad \text{(Equation 5a)};$$

$$vb\_I = vbe(Q\_I) + (RT2)(Iref) \quad \text{(Equation 5b)}.$$

FIG. 5 schematically shows a circuit diagram of a fourth example of an amplifier circuit AMP comprising an amplifier core AMP-CORE, a common tail circuit cTEC, and a bias voltage supply circuit BVS. The amplifier circuit AMP may comprise a common tail element circuit cTEC connected to the second STb (or to the first STa supply terminal not illustrated in FIG. 5). The common tail element circuit cTEC may be formed by an electrical connection from a negative supply terminal STb to ground GND. The common tail element circuit cTEC may not comprise any electrical or electronic component (apart from a wiring resistance of the electrical connection from the negative supply terminal STb to ground GND).

The bias voltage supply circuit BVS may comprise two current-to-voltage converters Q_h, Q_I, connected in series to a reference current source Iref for providing the bias voltages vb_h, vb_I. At least one of the current-to-voltage converters Q_h, Q_I may comprise a bipolar transistor, wherein a base of the bipolar transistor is connected to a collector of the bipolar transistor, and wherein the base of the bipolar transistor serves as output terminal of the respective current-to-voltage converter Q_h, Q_I. The bias voltage vb_h may be a sum of base-to-emitter voltages of the current-to-voltage converters Q_h and Q_I. The bias voltages vb_h and vb_I may be roughly calculable by following equation:

$$vb\_h = vbe(Q\_h) + vbe(Q\_I) \quad \text{(Equation 6a)};$$

$$vb\_I = vbe(Q\_I) \quad \text{(Equation 6b)}.$$

Figure 6:
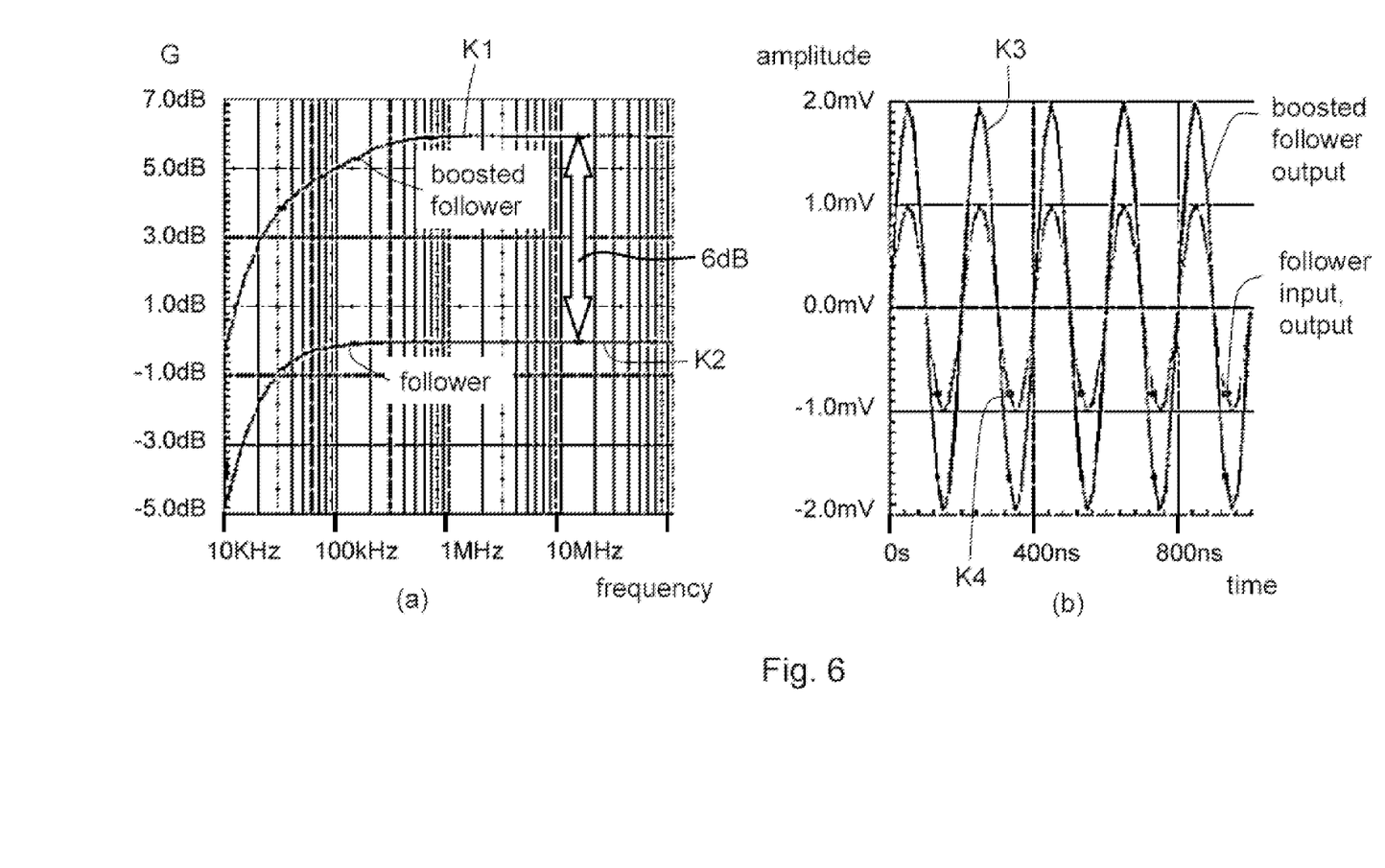
FIG. 6 schematically shows example diagrams of simulated gain as a function of frequency and of input and output voltages as a function of time of an amplifier circuit in bipolar technology according to FIG. 1 compared to gain as a function of frequency of a classical follower and compared to input and output voltages as a function of time of a classical follower.

The diagram on the left side of FIG. 6 shows gain G over frequency of an amplifier circuit AMP according to FIG. 1 (see curve K1) in comparison to gain G over frequency of a known follower circuit (see curve K2). The diagram on the right side of FIG. 6 shows input and output voltages over time of an amplifier circuit AMP according to FIG. 1 (see curve K3) in comparison to output voltages over time of a known follower circuit (see curve K4).

Figure 7:
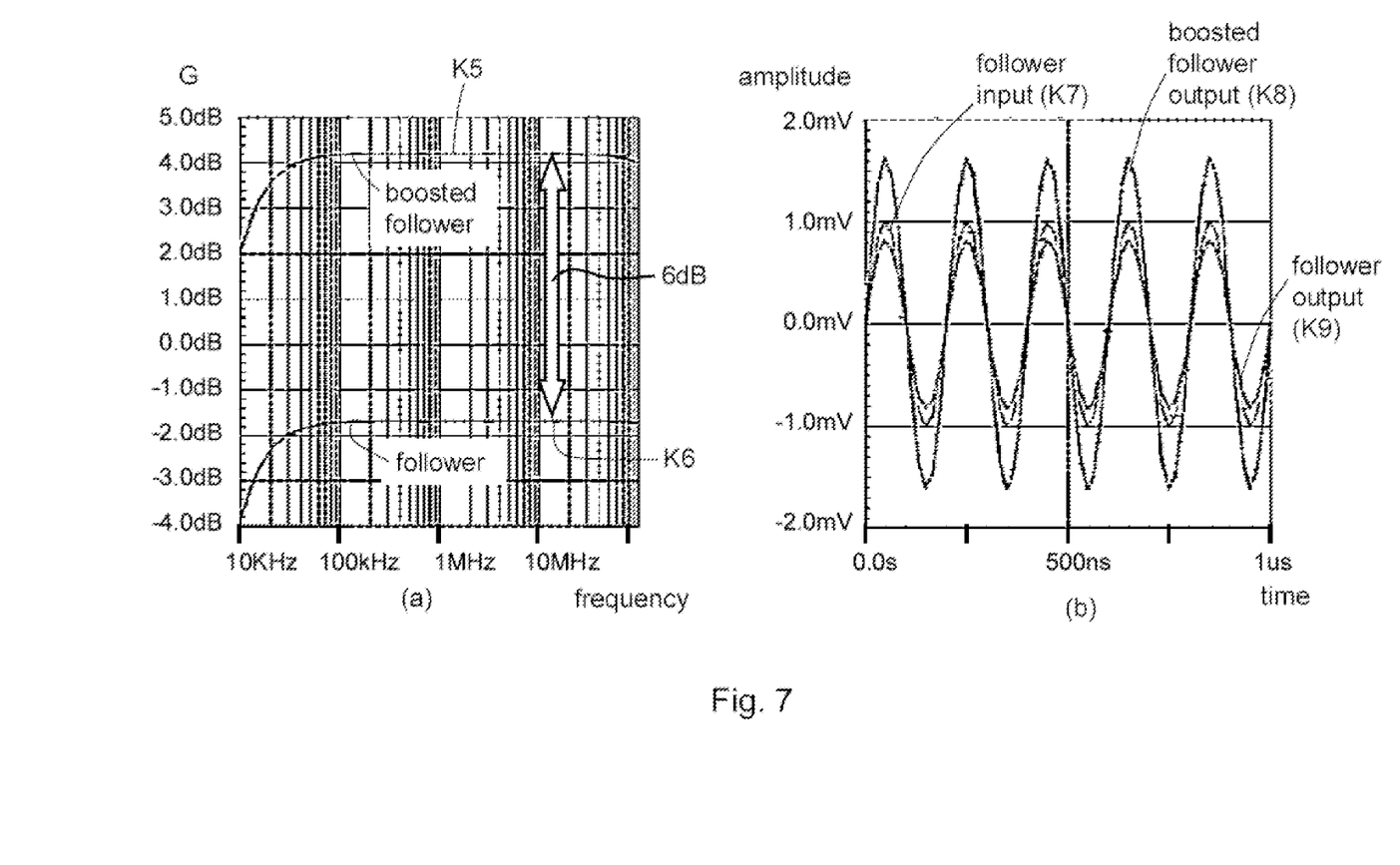
FIG. 7 schematically shows example diagrams of simulated gain as a function of frequency and of input and output voltages as a function of time as with FIG. 6, wherein, however, each semiconductor amplifier is implemented as a MOSFET (MOSFET=metal-oxide semiconductor field-effect transistor).

The diagram on the left side of FIG. 7 shows gain G over frequency of an amplifier circuit AMP according to FIG. 1 (see curve K5), when each of the four semiconductor amplifiers Q1, Q2, Q3, Q4 thereof is a MOSFET, in comparison to gain G over frequency of a known follower circuit (see curve K6). The diagram on the right side of FIG. 7 shows input and output voltages over time of an amplifier circuit AMP according to FIG. 1, when each of the semiconductor amplifiers Q1, Q2, Q3, Q4 thereof is a MOSFET (see curve K7 for the input voltage and curve K8 for the output voltage), in comparison to output voltage over time of a known follower circuit (see curve K7 for the input voltage and curve K9 for the output voltage).

Figure 8:
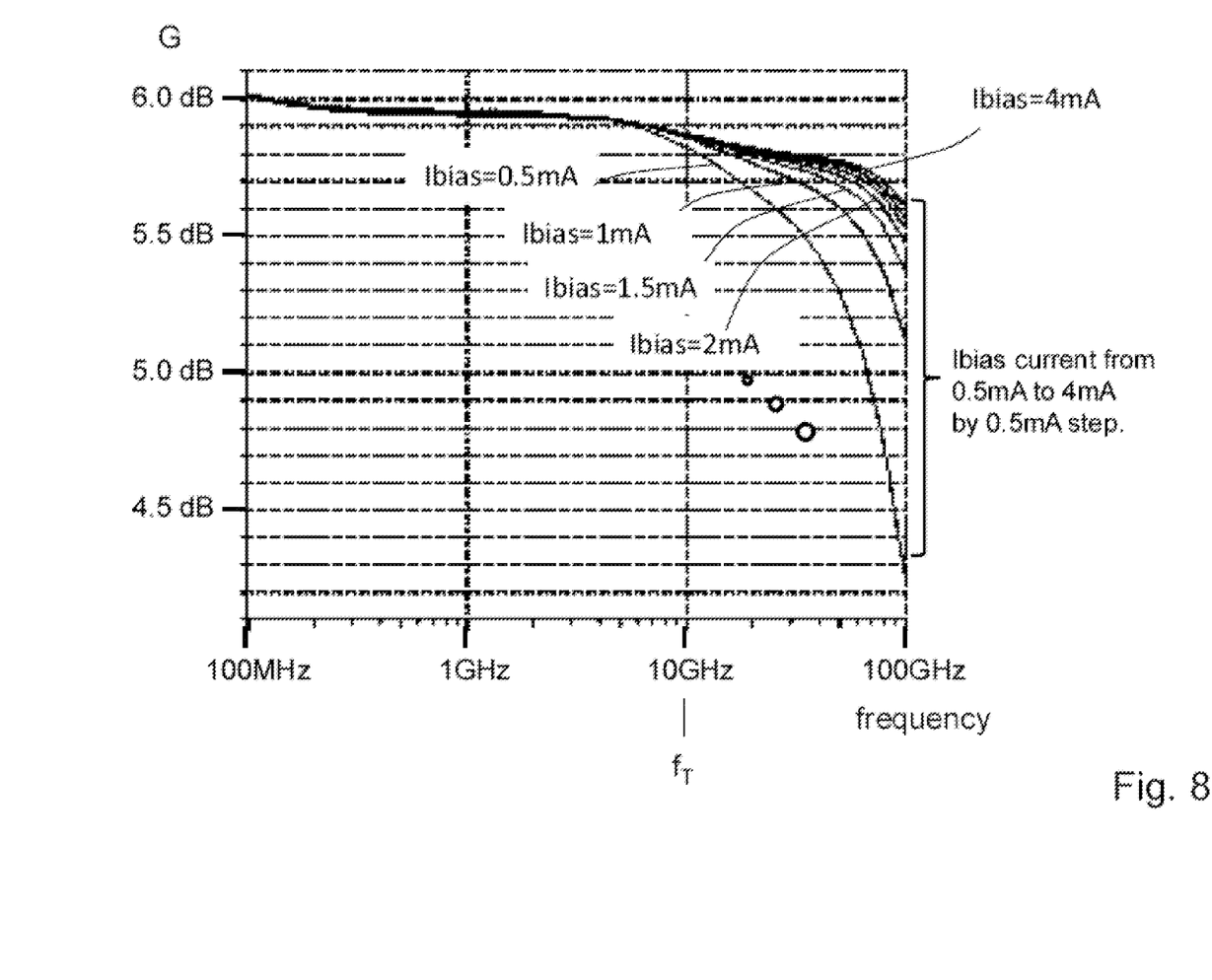
FIG. 8 schematically shows a diagram of simulated gain as a function of frequency of an amplifier circuit according to FIG. 1, for different bias current values.

FIG. 8 schematically shows an example diagram of gain G over frequency of an amplifier circuit AMP according to FIG. 1. The diagram shows that a gain of this topology at lower to mid frequencies (up to 10 GHz) may be not dependent on the bias current. Above 10 GHz, there may be some gain dependency (some drop) on bias current because of operating at the transfer frequency $f_T$ (where the input transistor pair may offer only a low Beta). In this operation region the bias current may be increased for maintaining or achieving a gain G of about 6 dB (see Equation 2).

A domain of application of the amplifier circuit AMP may range from low/mid RF-frequencies <1 GHz, high RF frequencies <10 GHz, and up to millimeter-wave RF frequencies 10 GHz to 100 GHz.

The amplifier circuit AMP may only require adjusting values of capacitors C1 to C4 employed for DC-insulation. The high-pass cutoff frequency (dependent on pairs C1R1, C2R2, C3R3, C4R4) may be set low enough compared to the transfer frequency $f_T$, in order to avoid an attenuation of the desired signal. Some first order high-pass filtering may be implemented taking benefit from the intrinsic filtering function of the pairs C1 R1, C2R2, C3R3, C4R4. The amplifier circuit AMP may comprise a first order high-pass filter, the filter comprising at least one resistor and at least one capacitor.

Figure 9:
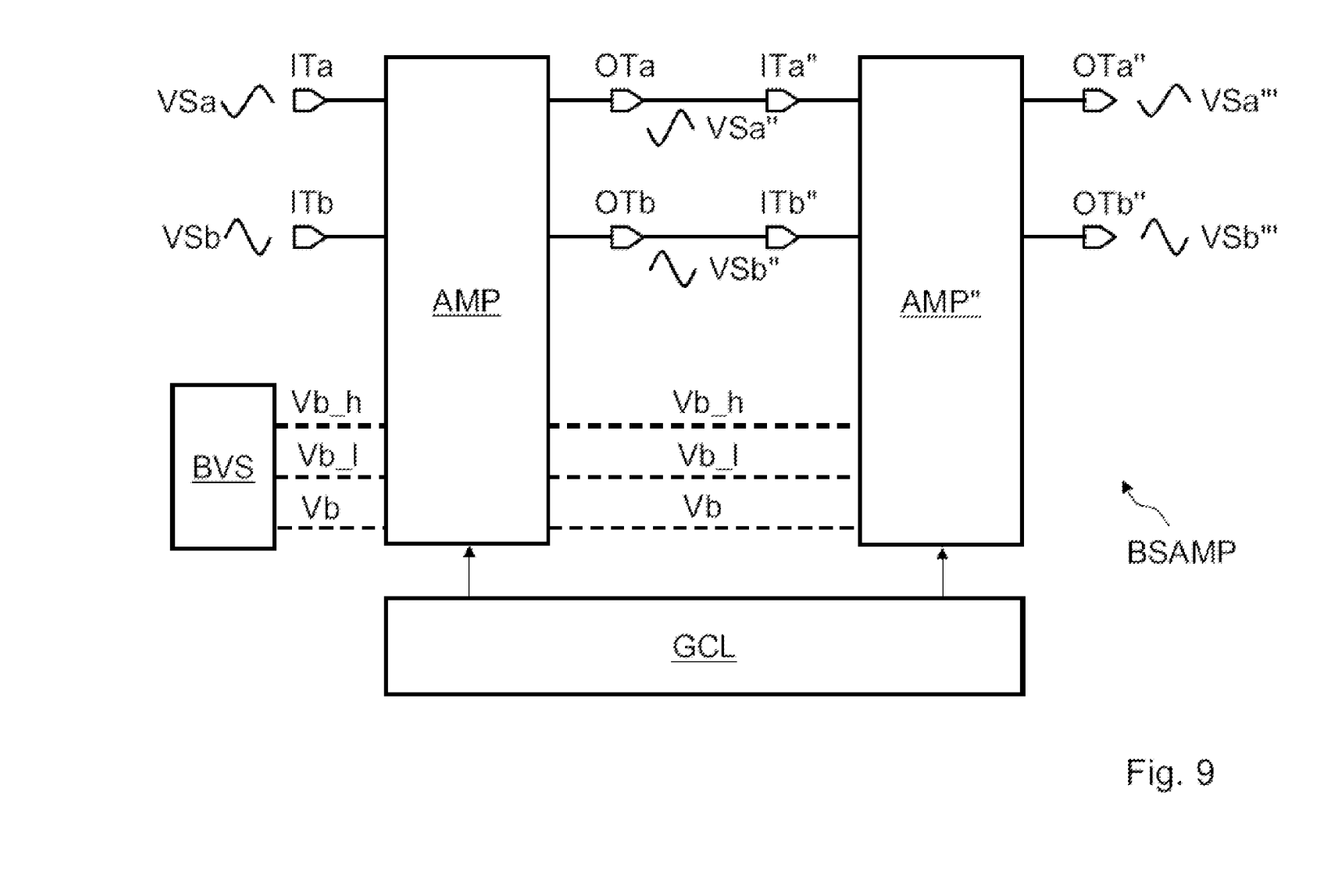
FIG. 9 schematically shows an example of a bi-stage amplifier circuit.

As shown in FIG. 9, the bi-stage amplifier circuit BSAMP may comprise a first amplifier circuit AMP and a second amplifier circuit AMP''', which may be implemented as described above. The second amplifier circuit AMP''' of FIG. 9 may be built as the amplifier circuit AMP described before. It may be built as shown in FIG. 1.

As shown, the first input terminal ITa''' of the second amplifier circuit AMP''' may be connected to the first output terminal OTa of the first amplifier circuit AMP. The second input terminal ITb''' of the second amplifier circuit AMP''' may be connected to the second output terminal OTb of the first amplifier circuit AMP.

Both amplifier stages AMP, AMP''' may share a same bias voltage supply circuit BVS and same bias voltage levels Vb_h, Vb_l, Vb (see bias supply net illustrated by dashed lines: Vb_h: high bias level; Vb_l: low bias level; Vb: bias level). Employing a same bias voltage supply circuit BVS for both amplifier stages AMP, AMP''' may allow reducing current consumption.

TABLE 3

Switch states of bi-stage amplifier circuit BSAMP of FIG. 9

| G | Sa, Sb | Sa'', Sb'' |
|---|---|---|
| 0 dB | open | open |
| +6 dB | closed | open |
| +6 dB | open | closed |
| +12 dB | closed | closed |

A common gain control logic circuit GCL may be used to select (close or open) internal gain control switches Sa'', Sb'' of each stage AMP, AMP''', as shown in Table 3, which may be similar to switches Sa, Sb in the example of FIG. 1. The same concept may be applied to the multi-stage amplifier circuit MSAMP shown in FIG. 10.

Figure 10:
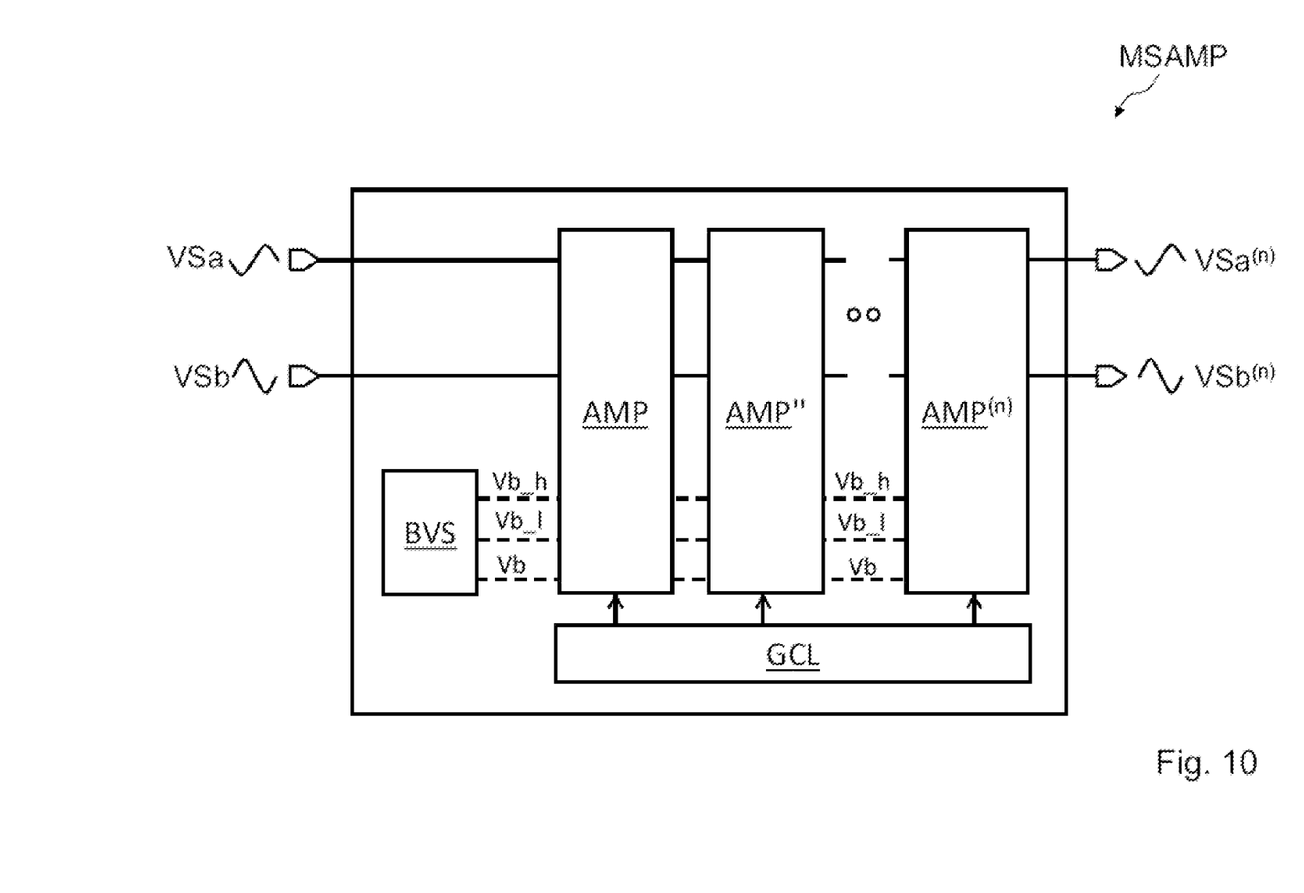
FIG. 10 schematically shows an example of a multi-stage amplifier circuit.

FIG. 10 shows a multi-stage amplifier circuit MSAMP that may comprise n cascaded stages of amplifier circuits AMP, AMP''', AMP$^{(n)}$. The multi-stage amplifier circuit MSAMP may comprise one of the amplifier circuits AMP as defined above and a second amplifier circuit AMP''' which may have the built of the same or any other of the amplifier circuits AMP as defined above. All or any subset of the amplifier circuit stages AMP, AMP''', AMP(n) of the multi-stage amplifier circuit MSAMP may have the built of the amplifier circuit AMP shown in FIG. 1. The multi-stage amplifier circuit MSAMP may be considered as a variable gain amplifier circuit (VGA circuit).

The multi-stage amplifier circuit MSAMP may avoid a trade-off of gain, bandwidth, accuracy, and bias current consumption features, wherein the trade-off may be intrinsic to conventional VGAs. This may offer an additional degree of freedom during design, allowing to reach fully optimized amplifier circuits with increased performance.

The amplifier circuits AMP, BSAMP, MSAMP may be used for replacing classical emitter follower stages in any place of a radar transceiver, or in any transceiver of a system, in any technology and for any application requiring low power consumption.

Figure 11:
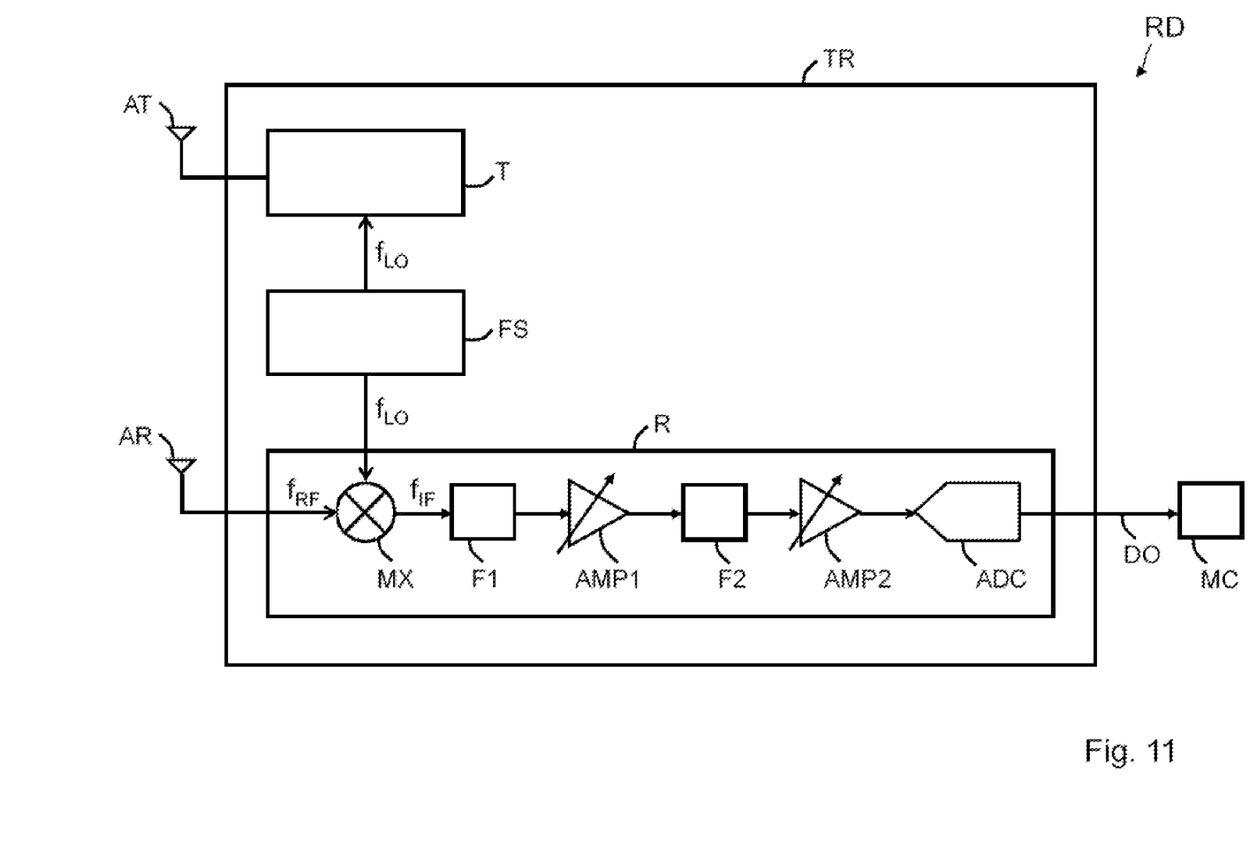
FIG. 11 schematically shows an example of a radio device comprising a transceiver, a transmitter antenna, and a receiver antenna, the transceiver connected to a microcomputer.

FIG. 11 schematically shows an example of a radio device RD that may comprise a transceiver TR, a transmitter antenna AT and a receiver antenna AR. The transceiver TR may comprise a transmitter section T, a receiver section R, and a frequency synthesizer section FS. The frequency synthesizer section FS may be connected to at least one of the transmitter section T and the receiver section R to provide a local oscillator frequency $f_{LO}$ to at least one of the transmitter section T and the receiver section R, respectively.

The receiver section R may comprise a mixer MX, a first filter F1, a first amplifier circuit AMP1, a second filter F2, a second amplifier circuit AMP2, and an analog-to-digital converter ADC. Each or any of both amplifier circuits AMP1, AMP2 may be any of the one-stage AMP, bi-stage BSAMP, or multi-stage MSAMP amplifier circuits described before.

A RF-amplifier circuit AMP1, AMP2 may comprise at least one of following: at least one of the suggested amplifier circuits AMP, at least one of the suggested bi-stage amplifier circuits BSAMP, at least one of the suggested multi-stage amplifier circuits MSAMP.

The analog-to-digital converter ADC may have a data output for providing output data DO (e.g. radar information) to be supplied to a microcontroller MC. The first filter F1 may comprise at least one of a high-pass filter, of a bandpass filter, and a low-pass filter. The transceiver TR may comprise more than one transmitter/receiver channels in parallel. The transceiver TR may comprise more than one pair of transmitter section T and receiver section R (although FIG. 11 shows only one pair). For each transmitter section T an own transmitter antenna AT may be provided. For each receiver section R an own receiver antenna AR may be provided.

As an example, in a typical radar receiver chip (or receiver path inside a transceiver), several receiver channels may be placed in parallel. In each channel, two or more multi-stage amplifier circuits MSAMP may be commonly used for accurately amplifying an input signal (VSb−VSa) up to certain required level.

Modern automotive radar technology uses a continuous wave frequency modulation (FMCW). This type of application may require a very accurate gain G in the whole receiver chain, together with accurate multi-stage gain steps when an automatic gain control (AGC) is used. The concept based on the novel programmable multi-stage amplifier circuit MSAMP may allow addressing this requirement.

Furthermore, radar transceiver products (for example transmitter sections, receiver sections, frequency synthesizer sections) may require buffer stages with low total power consumption. The suggested amplifier circuits AMP, BSAMP, MSAMP may represent an important contribution for facilitating to integrate such a transceiver in a compact single integrated circuit package.

A RF-transceiver TR may comprise at least one of the suggested RF-amplifier circuits AMP1, AMP2. A radio device RD may comprise one of the suggested RF-transceivers TR, and at least one of a receiver antenna AR and a transmitter antenna AT.

An integrated circuit may comprise at least one of following: at least one of the suggested amplifier circuits AMP, at least one of the suggested bi-stage amplifier circuits BSAMP, at least one of the suggested multi-stage amplifier circuits MSAMP, at least one of the suggested RF-amplifier circuits, at least one of the suggested RF-transceivers, at least one of the suggested radio devices RD.

The suggested amplifier may be realized with a lower overall die size than comparable conventional amplifiers. A very good gain accuracy may be not anymore dependent on dimensions of resistors or ratios of resistors, as it is the case for most of conventional multi-stage amplifiers.

In the foregoing specification, the invention has been described with reference to specific examples of embodiments of the invention. It will, however, be evident that various modifications and changes may be made therein without departing from the broader spirit and scope of the invention as set forth in the appended claims, and that the claims are not limited to the examples described above.

Any of the DC-insulations may be provided by at least one of a transformer, of a capacitor, of an optocoupler, or of a micro-mechanical coupler.

At least one of the amplifier circuits AMP, BSAMP, and MSAMP may comprise PNP bipolar semiconductor amplifiers instead of all or a subset of the NPN bipolar semiconductor amplifiers Q1, Q2, Q3, Q4, Q_h, Q_I, Qb.

Moreover, the terms first, second, third, fourth, and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals and/or data from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated examples may be implemented as circuitry located on a single integrated circuit or within a same device.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first", "second", "third", and "fourth" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An amplifier circuit, comprising:
a first transistor that controls a first current between a first supply terminal and a first output terminal;
a second transistor coupled to the first output terminal that controls a second current between the first output terminal and a second supply terminal;
a third transistor that controls a third current between the first supply terminal and a second output terminal;

a fourth transistor coupled to the second output terminal that controls a fourth current between the second output terminal and the second supply terminal;

a first input terminal connected to a first control terminal of the first transistor and coupled to a fourth control terminal of the fourth transistor with a first switch; and a second input terminal connected to a second control terminal of the second transistor and coupled to a third control terminal of the third transistor with a second switch, wherein a first input signal is received at the first input terminal and a second input signal is received at the second input terminal, the first input signal different from the second input signal such that a differential between the first input signal and the second input signal is received at the amplifier circuit, and wherein operation of the first or second switch controls a gain of the amplifier circuit.

2. The amplifier circuit according to claim 1, wherein each of the control terminals is connected to a bias circuit, for adjusting bias currents of each of the transistors.

3. The amplifier circuit according to claim 2, wherein each of the bias circuits comprises a resistor for connecting the related control terminal to a bias voltage supply.

4. The amplifier circuit according to claim 2, wherein at least two of the bias circuits have a common bias voltage supply.

5. The amplifier circuit according to claim 1, comprising a common tail element circuit connected to the first or to the second supply terminal for enforcing an anti-synchronous amplifier operation of a second branch of the amplifier circuit in relation to an amplifier operation of a first branch of the amplifier circuit, the first branch comprising the first and second transistors, the second branch comprising the third and fourth transistors.

6. The amplifier circuit according to claim 5, wherein the common tail element circuit comprises at least one of a current-source and a resistor connected in series between the second supply terminal and a ground.

7. The amplifier circuit according to claim 1, comprising a first direct current (DC) insulation between the first input terminal and the first control terminal.

8. The amplifier circuit according to claim 1, comprising a second direct current (DC) insulation between the second input terminal and the second control terminal.

9. The amplifier circuit according to claim 1, comprising a third direct current (DC) insulation between the second input terminal and the third control terminal.

10. The amplifier circuit according to claim 1, comprising a fourth direct current (DC) insulation between the first input terminal and the fourth control terminal.

11. The amplifier circuit according to claim 1, comprising a first order high-pass filter, the filter comprising at least one resistor and at least one capacitor.

12. A multi-stage amplifier circuit, comprising a cascade of a number of amplifier circuits according to claim 1, the multi-stage amplifier circuit having a gain control logic circuit connected to control a gain of at least one of the amplifier circuits.

13. A receiver section, comprising at least one of the amplifier circuits according to claim 12.

14. A radio frequency (RF) transceiver, comprising the receiver section according to claim 13, and a transmitter section.

15. A method of operating an amplifier circuit, the method comprising:

applying a first input signal to a first input terminal, the first input terminal connected to a first control terminal of a first transistor and coupled to a fourth control terminal of a fourth transistor with a first switch, wherein the first transistor controls a first current between a first supply terminal and a first output terminal;

applying a second input signal to a second input terminal, the second input terminal connected to a second control terminal of a second transistor and coupled to a third control terminal of a third transistor with a second switch, wherein the second transistor is coupled to the first output terminal and controls a second current between the first output terminal and a second supply terminal, the third transistor controls a third current between the first supply terminal and a second output terminal, and the fourth transistor is coupled to the second output terminal and controls a fourth current between the second output terminal and the second supply terminal; and operating the first and second switches to control a gain of the amplifier circuit, wherein the first and second input terminals are distinct, and the first and second input signals are different such that a differential is applied to the first and second input terminals.

* * * * *